United States Patent [19]
Herbert et al.

[11] Patent Number: 5,773,350
[45] Date of Patent: Jun. 30, 1998

[54] METHOD FOR FORMING A SELF-ALIGNED BIPOLAR JUNCTION TRANSISTOR WITH SILICIDE EXTRINSIC BASE CONTACTS AND SELECTIVE EPITAXIAL GROWN INTRINSIC BASE

[75] Inventors: Francois Herbert, Sunnyvale; Rashid Bashir, Santa Clara, both of Calif.

[73] Assignee: National Semiconductor Corporation, Santa Clara, Calif.

[21] Appl. No.: 891,451

[22] Filed: Jul. 10, 1997

Related U.S. Application Data

[63] Continuation of Ser. No. 789,052, Jan. 28, 1997, abandoned.
[51] Int. Cl.$^6$ .................................................. H01L 21/301
[52] U.S. Cl. ......................... 438/364; 438/366; 438/341; 438/350; 148/DIG. 10
[58] Field of Search .................................. 438/309, 337, 438/343, 347, 350, 364, 365, 366, 341; 148/DIG. 10

[56] References Cited

U.S. PATENT DOCUMENTS

| | | | |
|---|---|---|---|
| 4,849,371 | 7/1989 | Hansen et al. | 437/31 |
| 4,851,362 | 7/1989 | Suzuki | 437/31 |
| 5,024,957 | 6/1991 | Harame et al. | 437/31 |
| 5,234,844 | 8/1993 | Okita | 437/31 |
| 5,346,840 | 9/1994 | Fujioka | 437/31 |
| 5,365,090 | 11/1994 | Taka et al. | 257/197 |
| 5,484,737 | 1/1996 | Ryun et al. | 437/31 |
| 5,504,018 | 4/1996 | Sato | 437/31 |
| 5,591,656 | 1/1997 | Sawada | 437/31 |
| 5,614,425 | 3/1997 | Kimura et al. | 437/31 |

OTHER PUBLICATIONS

Mamoru Ugajin, et al., "SiGe Drift Base Bipolar Tansistor with Self–Aligned Selective CV–Tungsten Electrodes", IEEE Transactions on Electron Devices, vol. 41, No. 3, Mar. 1994, pp. 427–431.

Dietrich Vook, et al., "Double–Diffused Graded Si–Ge–Base Bipolar Transistors", IEEE Transactions on Electron Devices, vol. 41, No. 6, Jun. 1994, pp. 1013–1017.

Fumihiko Sato, et al., "A Super Self–Aligned Slectively Grown SiGe Base (SSSB) Bipolar Transistor Fabricated by Cold–Wall Type UHV/CVD Technology", vol. 41, No. 8, Aug. 1994, pp. 1373–1378.

R. Bashir, et al., "A Simple Process to Produce a High Wuality Silicon Surface Prior to Selective Epitaxial Growth", IEEE Electron Device Letters, vol. 16, No. 7, Jul. 1995, pp. 306–308.

*Primary Examiner*—Tuan H. Nguyen
*Attorney, Agent, or Firm*—Limbach & Limbach L.L.P.

[57] ABSTRACT

In a method of fabricating a self-aligned bipolar junction transistor with silicide extrinsic base contacts and selective epitaxial grown intrinsic base region, the sinker and buried N+ layer regions are formed in a semiconductor substrate with trench oxide isolation. Thin oxide is then formed on the structure. Next, metal silicide is deposited on the thin oxide and p-dopant implanted into the silicide. LTO is then deposited on the doped silicide followed by deposition of nitride. Next, the nitride, LTO and silicide layers are etched, stopping on the thin oxide layer. The thin oxide is then etched to expose the silicon. The etch undercuts the thin oxide under the nitride. A thin p+ epitaxial base is then selectively grown on the silicon and the metal silicide only. The base can be silicon or a silicon germanium layer to form a heterojunction transistor. Next, thin LTO is deposited followed by deposition of nitride. An RIE of the nitride is then performed to form nitride spacers, stopping on the thin LTO. The thin LTO is then wet etched to open the epitaxial base. A n-type, low-doped, selective single crystalline silicon emitter is then grown. This is followed by deposition of polysilicon and an n-dopant implant into the polysilicon. The polysilicon is then masked and etched to define a n+ polysilicon region in contact with the n-type single crystalline emitter. Next, a layer of oxide is deposited, followed by a furnace drive and rapid thermal anneal activation step for the base and emitter. Base, emitter and collector vias are opened and a metallization layer is formed and patterned to provide base, emitter and collector contacts.

12 Claims, 6 Drawing Sheets

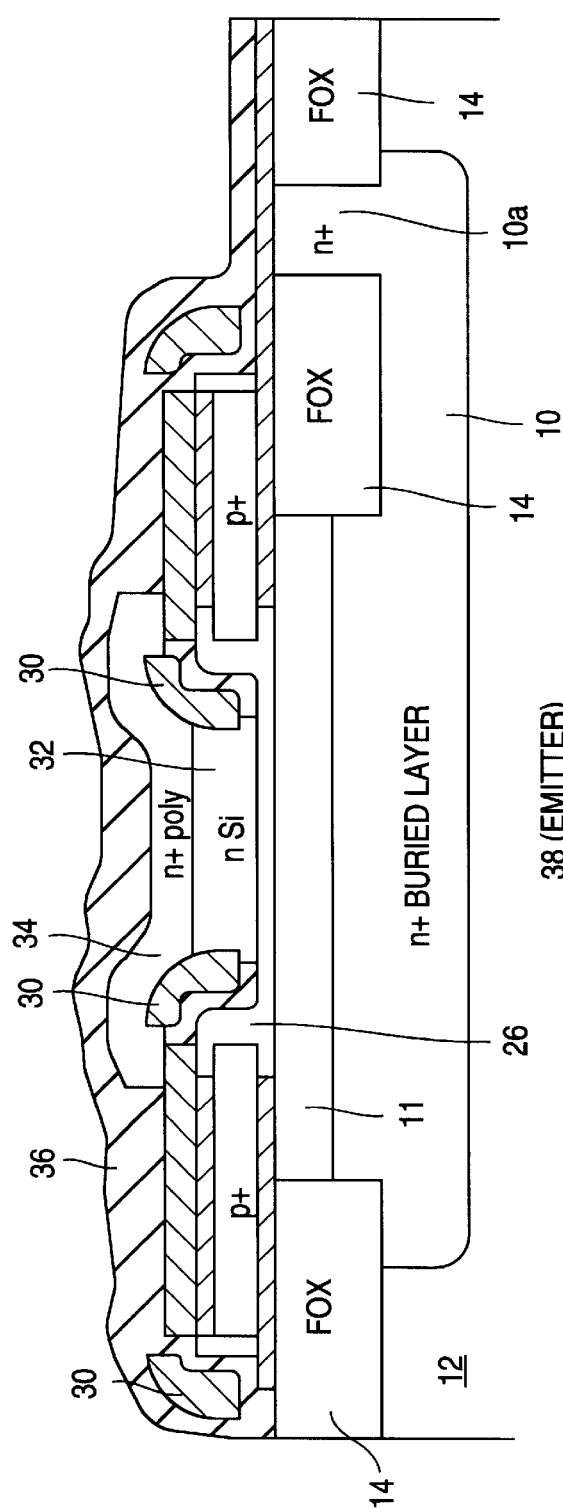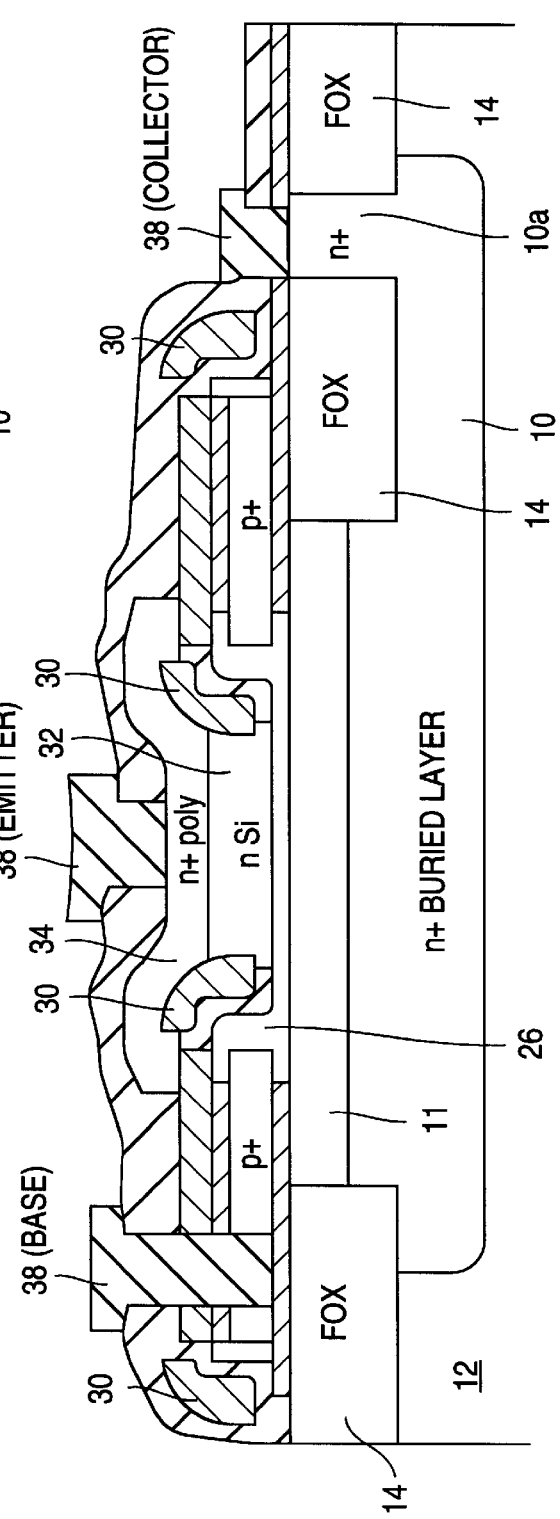
FIG. 1G
FIG. 1H

METHOD FOR FORMING A SELF-ALIGNED BIPOLAR JUNCTION TRANSISTOR WITH SILICIDE EXTRINSIC BASE CONTACTS AND SELECTIVE EPITAXIAL GROWN INTRINSIC BASE

This is a continuation of application No. 08/789,052 filed on Jan. 28, 1997 now abandoned.

BACKGROUND OF THE INVENTION

1. Field of the Invention

The present invention relates to bipolar junction transistors (BJT) and, in particular, to a BJT structure that achieves excellent contact between the extrinsic and intrinsic base regions by selectively growing the base layer on the sidewall of and underneath the metal silicide extrinsic base. The fabrication process also allows for the formation of a low capacitance emitter-base junction by growing a selective low doped emitter region.

2. Discussion of the Related Art

Sato, et al., "A Super Self-Aligned Selectively Grown SiGe Base (SSSB) Bipolar Transistor Fabricated by Cold-Walled Type UHV/CVD Technology," IEEE Transactions on Electron Devices, Vol. 41, No. 8, Aug. 1994, pp. 1373–1378, discloses a selective epitaxial growth (SEG) technology for fabricating the intrinsic SiGe base layer of a double polysilicon self-aligned bipolar transistor. The growth conditions of the Sato, et al. process are optimized so that silicon or SiGe grows selectively against silicon nitride both on the single crystalline silicon and on the polysilicon of a structure consisting of a polysilicon layer that overhangs the single crystalline silicon substrate. The selective growth is maintained until the growth from the bottom silicon and the top polysilicon coalesce. This selective growth permits a novel emitter-base selfaligned heterojunction bipolar transistor.

U.S. Pat. No. 5,101,256, issued to Harame, et al. on Mar. 31, 1992, titled, "Bipolar Transistor With Ultra-Thin Epitaxial Base And Method Of PATENT Fabricating Same," discloses a method of forming a bipolar transistor using a non-selective growth process and photoresist plug formation for removal of unwanted polysilicon in the base layer from the top of the extrinsic base contacts. In accordance with the process of the '957 patent, there is no undercut of the oxide insulator under the extrinsic base contact region and, therefore, no growth takes place under the highly doped extrinsic base region.

U.S. Pat. No. 5,346,840 issued to Fujioka on Sep. 13, 1994, titled, "Method Of Producing Heterojunction Bipolar Transistor Having Narrow Bandgap Base Type," discloses the use of a SiGe base growth over the entire wafer and the use of etching to form mesa-type structures. Since the device is a spacer-out type device, the emitter width is determined by lithography. The process disclosed by Fujioka uses a selective tungsten process over the p+ SiGe base which is separated from the emitter by a spacer.

SUMMARY OF THE INVENTION

The present invention provides a bipolar junction transistor that uses a spacer-inside structure. The structure uses selective epitaxial growth of SiGe on silicon and metal silicide. The metal is already deposited and not grown after the base region, as is the case in the prior art processes. Furthermore, the growth is performed on the sidewall of and underneath the metal silicide, thereby providing a better contact between the intrinsic and extrinsic base regions. The process can also be used to provide in-situ doped emitter structures.

In a method in accordance with the present invention, a low resistance sinker and buried n+ layer are formed in a semiconductor substrate, with shallow and/or deep trench oxide structures providing isolation. A layer of thin oxide is then deposited or grown on the structure. This is followed by deposition of metal silicide, preferably tungsten silicide, on the thin oxide and implantation of ptype dopant, e.g. boron, into the metal silicide to achieve the desired conductivity level. A layer of low temperature oxide (LTO) is then deposited on the p-doped silicide followed by deposition of silicon nitride. Next, the nitride, LTO and silicide layers are etched, stopping on the thin oxide layer. The thin oxide is then etched to expose the silicon surface. The thin oxide etch results in undercutting of thin oxide under the nitride. A thin p+ epitaxial base is then selectively grown on the silicon and the metal silicide only. The base can be either silicon or silicon germanium to form a heterojunction transistor. Next, thin LTO is deposited followed by deposition of nitride. A reactive ion etch (RIE) of the nitride is then performed to form nitride spacers, stopping on the thin LTO. The thin LTO is then wet etched to open the epitaxial base. A n-type, low-doped, selective single crystalline silicon emitter is then grown on the epitaxial base. This is followed by deposition of polysilicon and an implant of n-type dopant, e.g. arsenic, into the polysilicon. The polysilicon is then masked and etched to define a n+ polysilicon region in contact with the n-type single crystalline emitter. Next, a layer of oxide is deposited, followed by a furnace drive and rapid thermal anneal activation steps for the base and emitter. Base, emitter and collector vias are then opened and a metallization layer is formed and patterned to provide base, emitter and collector contacts.

In an alternative embodiment, following the above-defined flow for n-type silicon emitter formation, the thin LTO is wet etched to open the epitaxial base. The n-type, low-doped, selective single crystalline emitter is then formed and an n+ high doped emitter contact is grown. Oxide is then deposited and a furnace drive and rapid thermal anneal activation steps performed for the base and emitter. Contact openings for the base, emitter and collector are then formed, followed by formation of a metallization pattern to provide the base, emitter and collector contacts.

In accordance with a second alternative embodiment, after formation of the n-type silicon emitter as described above, the thin LTO is etched to open the epitaxial base and polysilicon is deposited and implanted with arsenic The polysilicon is masked and patterned and a layer of oxide is deposited. The furnace drive and rapid thermal anneal activation steps are then performed for the base and emitter. Again, contact openings for the base, emitter and collector are formed and a metallization pattern for the base, emitter and collector contacts is defined.

A better understanding of the features and advantages of the present invention will be obtained by reference to the following detailed description and accompanying drawings which set forth illustrative embodiments in which the principles of the invention are utilized.

BRIEF DESCRIPTION OF THE DRAWINGS

FIGS. 1A–1H provide a sequence of cross-section drawings illustrating a method of fabricating a bipolar junction transistor in accordance with the present invention.

DETAILED DESCRIPTION OF THE INVENTION

Figure 1A:
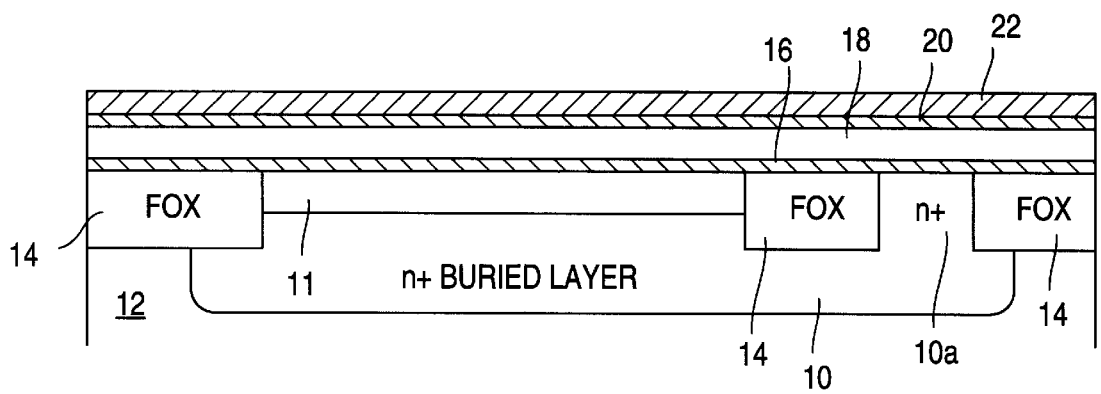

Referring to FIG. 1A, a process for fabricating a self-aligned bipolar junction transistor (BJT) in accordance with the present invention begins with the formation of a low resistance sinker region 10a and n+ buried layer 10 in a semiconductor substrate 12, shallow and/or deep trench oxide structures 14 providing isolation. An n-type collector region 11 (5e16-3e17 #/cu. cm.) is formed at the surface of the buried layer 10. A thin layer of silicon oxide 16 approximately 500 Å thick is then grown over the surface of the device. Next, approximately 2000 Å of a metal silicide 18, e.g., tungsten silicide, is deposited on the thin oxide and a p+ type dopant, e.g., boron, is implanted into the silicide to provide a desired dopant profile. Next, 5000 Å of low temperature oxide (LTO) 20 is deposited on the silicide layer 18, followed by deposition of about 1000 Å of silicon nitride 22 on the LTO layer 20, resulting in the structure shown in FIG. 1A.

Figure 1B:
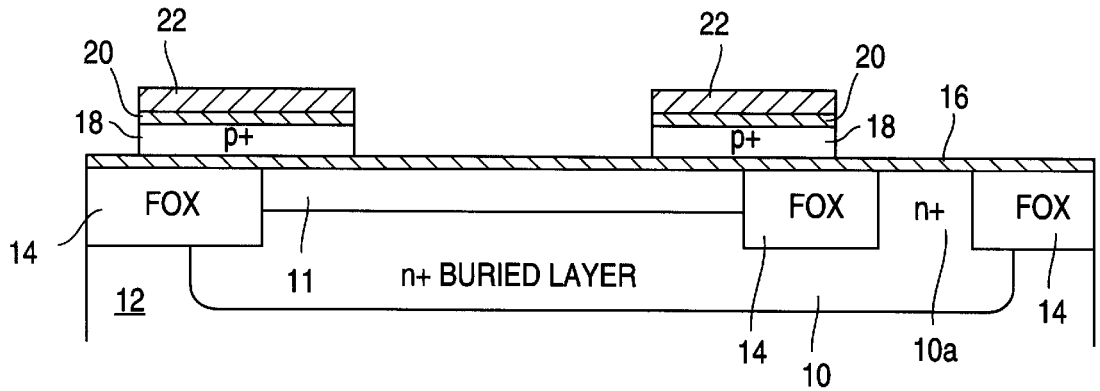

Referring to FIG. 1B, using a photoresist mask, an anisotropic etch of the nitride layer 22, oxide layer 20 and the silicide layer 18 is performed, stopping on the thin oxide layer 16.

Figure 1C:
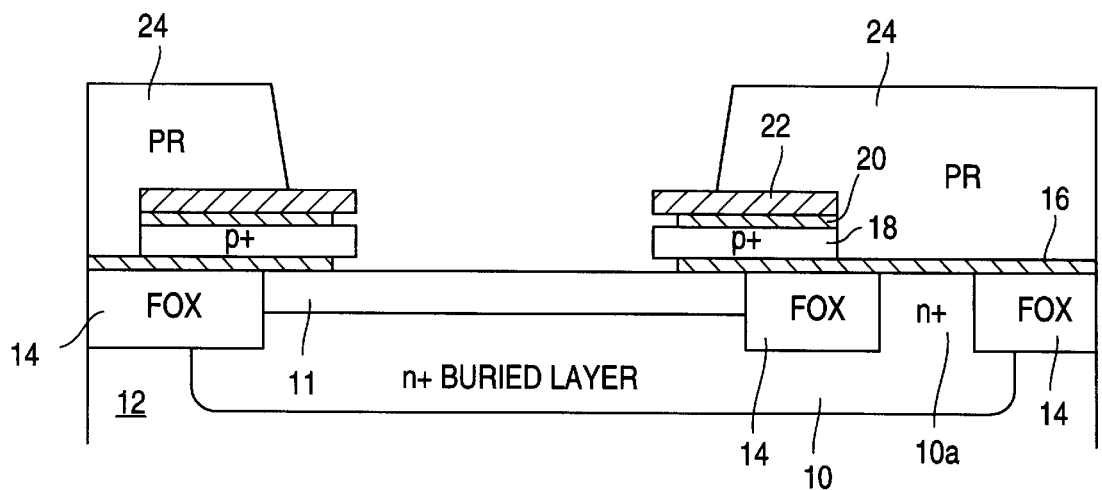

Next, as shown in FIG. 1C, using a photoresist mask 24, the thin oxide 16 is etched to expose the underlying surface of the silicon substrate. As shown in FIG. 1C, the etch results in the undercutting of the thin oxide 16 and 20 under the silicide layer 18 and the nitride layer 22, respectively.

Figure 1D:
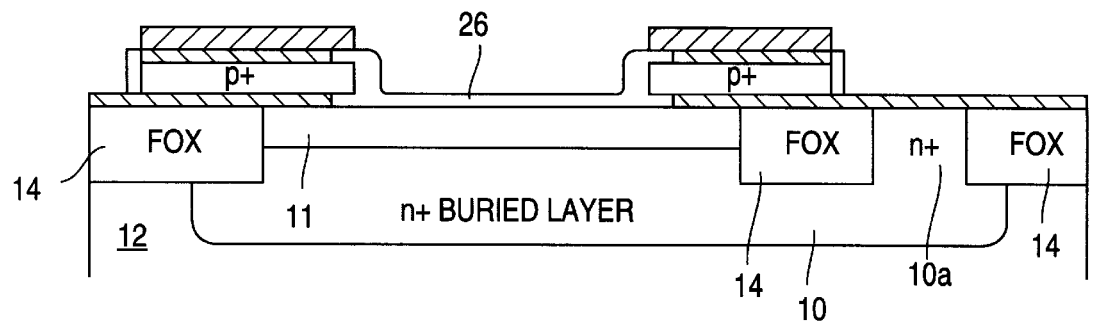

Next, a thin p+ epitaxial base layer 26 is selectively grown on the silicon and the silicide 18 only. The p+ base layer 26 can be either Si or SiGe to form a heterojunction transistor. The resulting structure is shown in FIG. 1D.

Figure 1E:
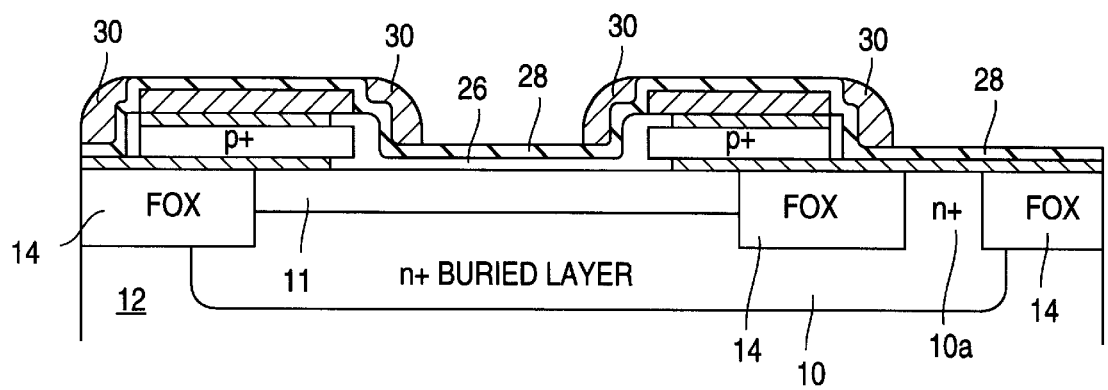

Next, referring to FIG. 1E, about 300 Å of low temperature oxide 28 is deposited followed by deposition of about 3000 Å of nitride. The nitride layer is then reactive ion etched to form nitride spacers 30, stopping on the thin 300 Å LTO layer 28.

Figure 1F:
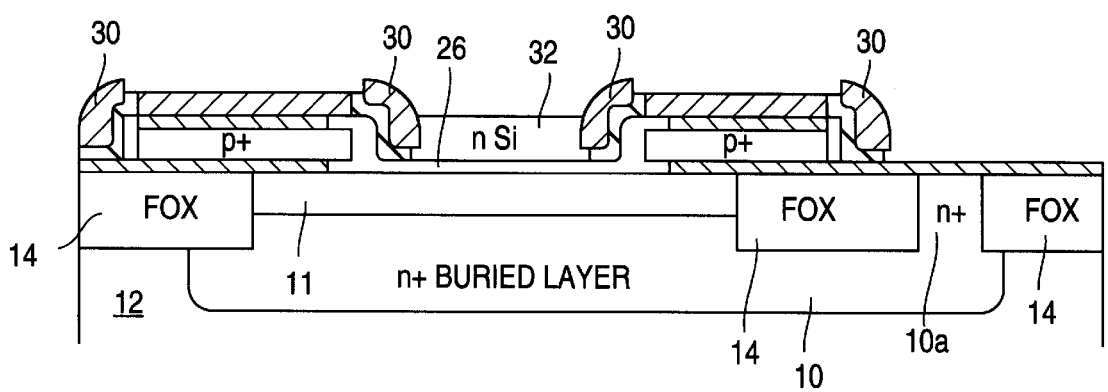

After the RIE etch of the nitride layer, the thin LTO layer 28 is wet etched to open the epitaxial base 26 and an n-type low doped, selective single crystalline silicon emitter region 32 is grown, resulting in the structure shown in FIG. 1F.

Next, as shown in FIG. 1G, a polysilicon layer is deposited and implanted with an n-type dopant, e.g., arsenic. The polysilicon layer is then masked and etched to define an n+ polysilicon region 34. This is followed by deposition of an oxide layer 36, resulting in the structure shown in FIG. 1G.

Finally, following a furnace drive and rapid thermal anneal (RTA) for activation of the base and emitter regions, contact openings are formed for the base, emitter and collector regions and a final metallization interconnect pattern 38 is provided. The final device structure is shown in FIG. 1H.

Figure 2A:
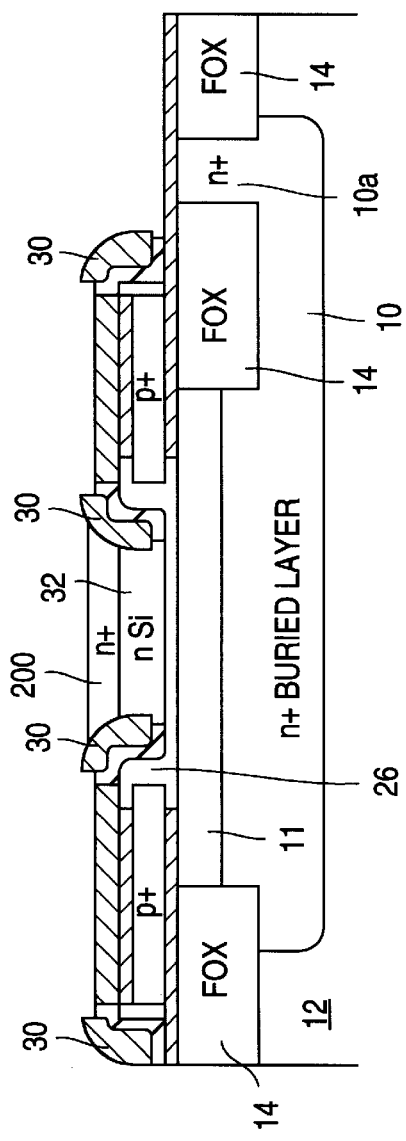
FIGS. 2A–2C provide a sequence of cross-section drawings illustrating an alternate method of fabricating an emitter structure for a bipolar junction transistor in accordance with the concepts of the present invention.
Figure 2B:
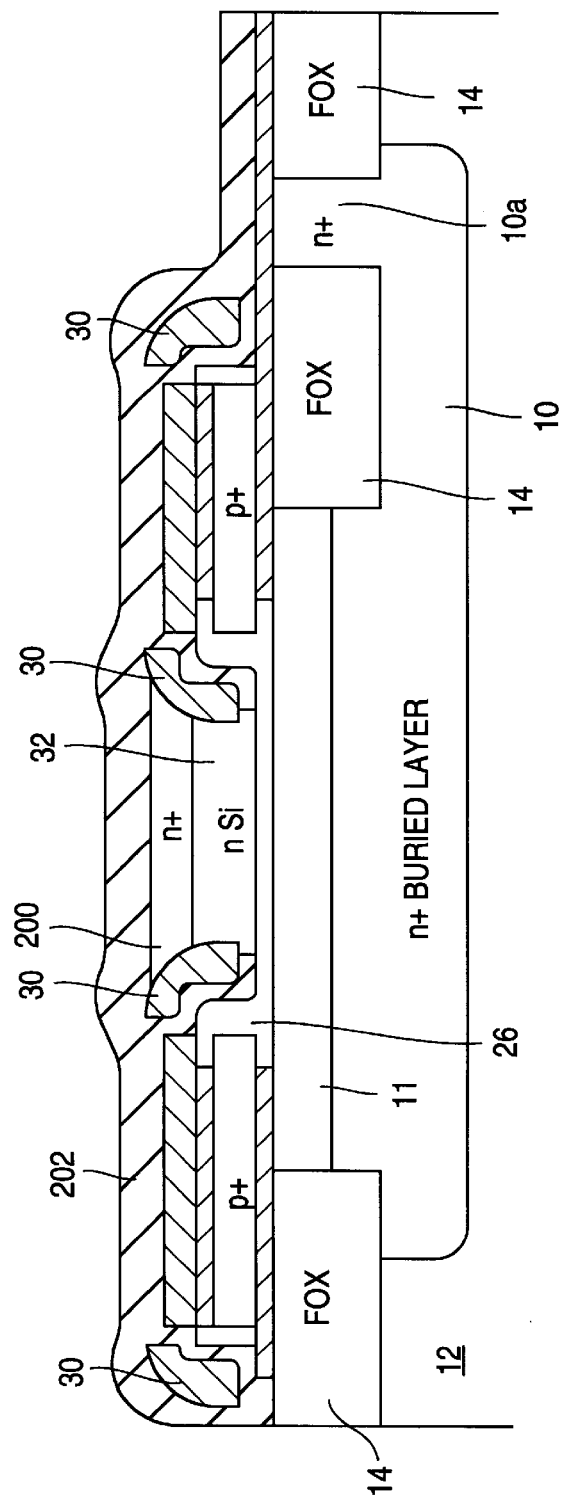
Figure 2C:
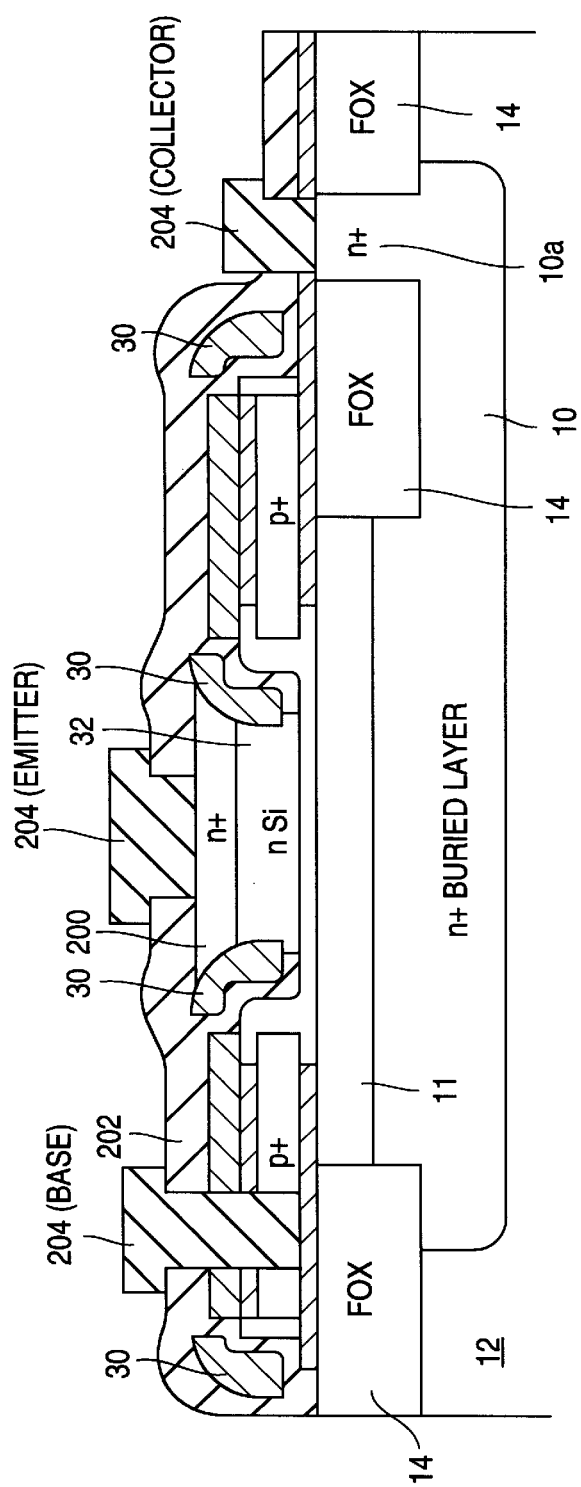

Alternatively, the emitter formation can proceed in accordance with the flow module shown in FIGS. 2A–2C.

Turning to FIG. 2A, following the process described above through the steps required to provide the structure shown in FIG. 1E, the thin oxide layer 28 is etched to expose the epitaxial base 26. This is followed by growth of an n-type low doped, selective single crystalline silicon emitter 32 and the growth of an n+ silicon high doped emitter contact 200, resulting in the structure shown in FIG. 2A.

Next, as shown in FIG. 2B, an oxide layer 202 is then deposited.

Next, as shown in FIG. 2C, a furnace drive and rapid thermal anneal step are performed to activate the base and emitter regions, the contacts for the base, emitter and collector regions are opened and a final metallization pattern 204 is provided, resulting in the structure shown in FIG. 2C.

Figure 3A:
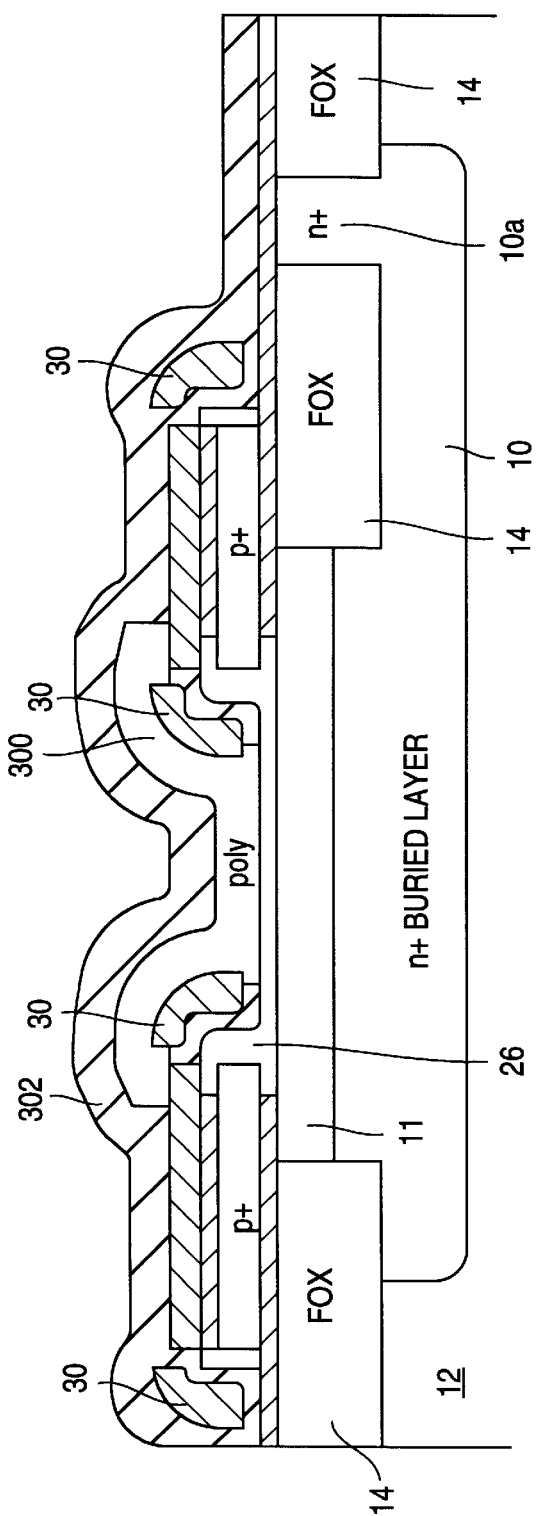
FIGS. 3A and 3B are cross-section drawings illustrating a second alternate method of fabricating an emitter structure for a bipolar junction transistor in accordance with the concepts of the present invention.
Figure 3B:
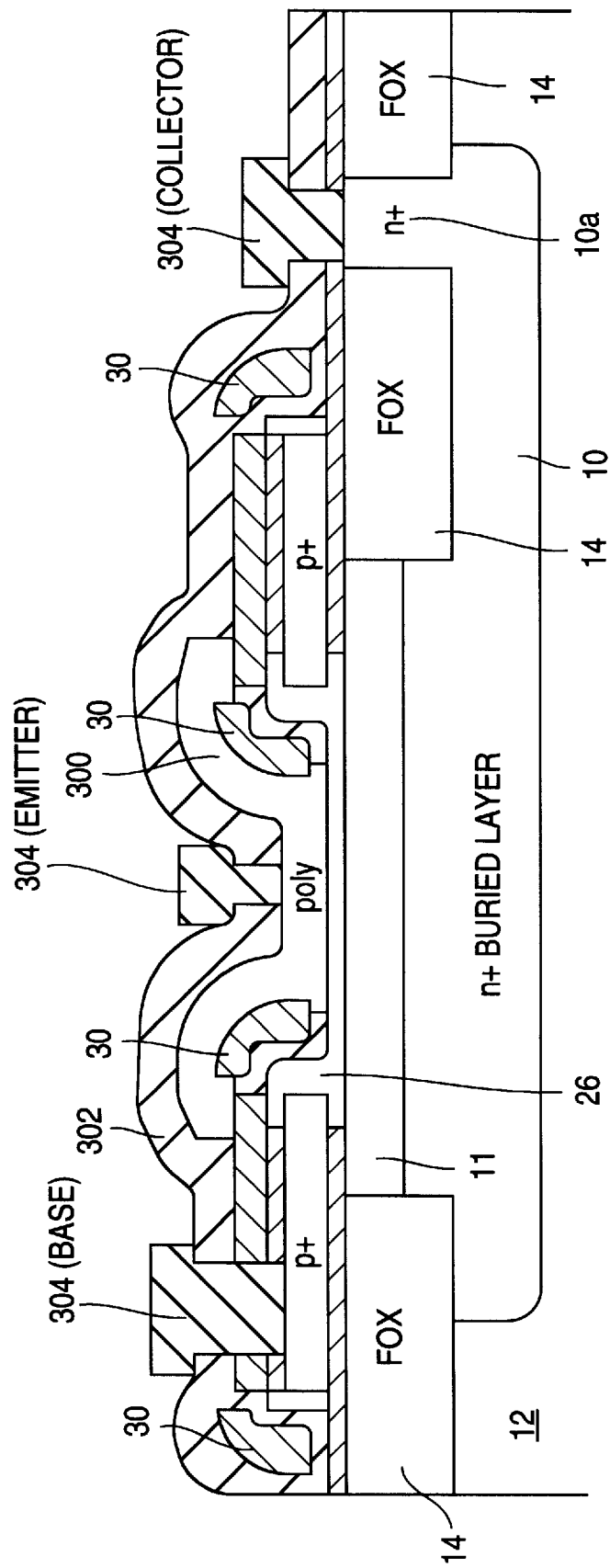

A second alternative embodiment for fabrication of the emitter region is illustrated in FIGS. 3A and 3B.

Again, following the process described above through the steps required to provide the structure shown in FIG. 1E, a wet etch of the thin oxide 28 is then performed to expose the epitaxial base 26. Next, polysilicon is deposited and implanted with a p-type dopant, e.g., arsenic. The structure is then masked and etched to define a p+ polysilicon region 300 and an oxide layer 302 is deposited, resulting in the structure shown in FIG. 3A.

Next, a furnace drive and rapid thermal anneal step are performed to activate the base and emitter. Base, emitter and collector region contacts are then opened and a final metallization pattern 304 is provided, resulting in the structure shown in FIG. 3B.

It should be understood that various alternatives to the embodiments of the invention described herein may be employed in practicing the invention. Thus, it is intended that the following claims define the scope of the invention and that methods and structures within the scope of these claims and their equivalents be covered thereby.

What is claimed is:

1. A method of fabricating a bipolar junction transistor having silicide extrinsic base contacts and a selective epitaxial grown intrinsic base region, the method comprising:

forming a buried region of n-type conductivity in a semiconductor substrate;

forming a first layer of silicon oxide on the buried region;

forming a layer of refractory metal silicide on the first silicon oxide layer;

implanting p-type dopant into the refractory metal silicide layer;

forming a second layer of silicon oxide on the doped metal silicide layer;

forming a first layer of silicon nitride on the second layer of silicon oxide;

etching the first silicon nitride, second silicon oxide and metal silicide layers, stopping on the first silicon oxide layer;

etching the first silicon oxide layer to expose the buried region;

growing an epitaxial base region of p-type conductivity selectively on the buried region;

forming a third silicon oxide layer on the epitaxial base region;

forming a second silicon nitride layer on the third silicon oxide layer;

patterning the second silicon nitride layer to form nitride spacers, stopping on the third silicon oxide layer;

etching the third silicon oxide layer to expose the epitaxial base region;

growing an emitter region of n-type conductivity on the epitaxial base region;

forming a layer of polysilicon on the emitter region;

implanting the polysilicon with n-type dopant;

patterning the doped polysilicon layer to define a doped polysilicon region in contact with the emitter region;

depositing a fourth layer of silicon oxide on the structure resulting from previously-recited steps;

performing furnace drive and rapid thermal anneal activation steps;

forming first, second and third contact openings in the structure resulting from the previously-recited steps to expose the doped metal silicide layer, the doped polysilicon region and the buried layer, respectively; and forming a patterned metallization layer that provides metal contact to the doped metal silicide layer, the doped polysilicon region and the buried layer via the first, second and third contact openings, respectively.

2. A method as in claim 1 wherein the first layer of silicon oxide is about 500 Å thick.

3. A method as in claim 1 wherein the refractory metal silicide comprises tungsten silicide.

4. A method as in claim 3 wherein the layer of tungsten silicide is about 2,000 Å thick.

5. A method as in claim 3 wherein the p-type dopant is boron.

6. A method as in claim 3 wherein the second layer of silicon oxide is about 5,000 Å thick.

7. A method as in claim 6 wherein the first layer of silicon nitrite is about 1,000 Å thick.

8. A method as in claim 7 wherein the second layer of silicon nitride is about 3,000 Å thick.

9. A method as in claim 1 wherein the epitaxial base region comprises silicon.

10. A method as in claim 1 wherein the epitaxial base region comprises SiGe.

11. A method of fabricating a bipolar junction transistor having silicide extrinsic base contacts and a selective epitaxial grown intrinsic base region, the method comprising:

forming a buried region of n-type conductivity in a semiconductor substrate;

forming a first layer of silicon oxide on the buried region;

forming a layer of refractory metal silicide on the first silicon oxide layer;

implanting p-type dopant into the refractory metal silicide layer;

forming a second layer of silicon oxide on the doped metal silicide layer;

forming a first layer of silicon nitride on the second layer of silicon oxide;

etching the first silicon nitride, second silicon oxide and metal silicide layers, stopping on the first silicon oxide layer;

etching the first silicon oxide layer to expose the buried region;

growing an epitaxial base region of p-type conductivity selectively on the buried region;

forming a third silicon oxide layer on the epitaxial base region;

forming a second silicon nitride layer on the third silicon oxide layer;

patterning the second silicon nitride layer to form nitride spacers, stopping on the third silicon oxide layer;

etching the third silicon oxide layer to expose the epitaxial base region;

growing an emitter region of n-type conductivity on the epitaxial base region;

forming a silicon region of n-type conductivity on the emitter region;

depositing a fourth layer of silicon oxide on the structure resulting from the above-recited steps;

performing furnace drive and rapid thermal anneal activation steps;

forming first, second and third contact openings in the structure resulting from the previously-recited steps to expose the doped metal silicide layer, the n-type silicon region and the buried layer, respectively; and forming a patterned metallization layer that provides metal contact to the doped metal silicide layer, the n-type silicon region and the buried layer via the first, second and third content openings, respectively.

12. A method of fabricating a bipolar junction transistor having silicide extrinsic base contacts and a selective epitaxial grown intrinsic base region, the method comprising:

forming a buried region of n-type conductivity in a semiconductor substrate;

forming a first layer of silicon oxide on the buried region;

forming a layer of refractory metal silicide on the first silicon oxide layer;

implanting p-type dopant into the refractory metal silicide layer;

forming a second layer of silicon oxide on the doped metal silicide layer;

forming a first layer of silicon nitride on the second layer of silicon oxide;

etching the first silicon nitride, second silicon oxide and metal silicide layers, stopping on the first silicon oxide layer;

etching the first silicon oxide layer to expose the buried region;

growing an epitaxial base region of p-type conductivity selectively on the buried region;

forming a third silicon oxide layer on the epitaxial base region;

forming a second silicon nitride layer on the third silicon oxide layer;

patterning the second silicon nitride layer to form nitride spacers, stopping on the third silicon oxide layer;

etching the third silicon oxide layer to expose the epitaxial base region;

depositing polysilicon on the structure resulting from the above-recited steps and implanting the polysilicon with n-type dopant;

masking and etching the doped polysilicon to define a polysilicon region in contact with the epitaxial base region;

depositing a fourth layer of silicon oxide on the structure resulting from the above-recited steps;

performing furnace drive and rapid thermal anneal activation steps;

forming first, second and third contact openings in the structure resulting from the previously-recited steps to expose the doped metal silicide layer, the polysilicon region, and the buried region, respectively; and forming a patterned metallization layer that provides metal contact to the doped metal silicide layer, the polysilicon region and the buried region via the first, second and third contact openings, respectively.

\* \* \* \* \*

UNITED STATES PATENT AND TRADEMARK OFFICE
CERTIFICATE OF CORRECTION

PATENT NO.   : 5,773,350
DATED        : June 30, 1998
INVENTOR(S)  : Francois Hebert et al.

It is certified that error appears in the above-identified patent and that said Letters Patent is hereby corrected as shown below:

In Col. 5, line 29, Claim 8 should be numbered as Claim 10;

In Col. 5, line 31, Claim 9 should be numbered as Claim 8;

In Col. 5, line 33, Claim 10 should be numbered as Claim 9.

On the title page, Item [19]: "Herbert" should read --Hebert--

Item [75]: "Francois Herbert" should read --Francois Hebert--.

Signed and Sealed this

First Day of September, 1998

*Attest:*

BRUCE LEHMAN

*Attesting Officer*     *Commissioner of Patents and Trademarks*